United States Patent [19]

Blanchard

[11] Patent Number: 5,668,025

[45] Date of Patent: Sep. 16, 1997

[54] METHOD OF MAKING A FET WITH DIELECTRICALLY ISOLATED SOURCES AND DRAINS

[75] Inventor: Richard A. Blanchard, Los Altos, Calif.

[73] Assignee: SGS-Thomson Microelectronics, Inc., Carrollton, Tex.

[21] Appl. No.: 397,654

[22] Filed: Feb. 28, 1995

[51] Int. Cl.⁶ .................................................. H01L 21/265
[52] U.S. Cl. ............................................. 438/207; 438/489
[58] Field of Search ........................... 437/40 GS, 41 GS, 437/34, 57, 99

[56] References Cited

U.S. PATENT DOCUMENTS

| | | | |
|---|---|---|---|
| 4,041,518 | 8/1977 | Shimizu et al. | 437/99 |
| 4,487,639 | 12/1984 | Lam et al. | |
| 4,609,407 | 9/1986 | Masao et al. | 148/1.5 |
| 4,651,408 | 3/1987 | MacElwee et al. | 437/99 |
| 4,874,716 | 10/1989 | Rao | |
| 4,879,255 | 11/1989 | Deguchi et al. | 437/99 |
| 4,914,053 | 4/1990 | Matyi et al. | 437/90 |
| 4,966,861 | 10/1990 | Mieno et al. | 437/99 |
| 5,110,757 | 5/1992 | Arst et al. | 437/99 |
| 5,213,991 | 5/1993 | Inokawa et al. | 437/99 |
| 5,338,697 | 8/1994 | Aoki et al. | 437/40 GS |
| 5,422,303 | 6/1995 | Klose et al. | 437/90 |
| 5,498,567 | 3/1996 | Klose et al. | 437/90 |

FOREIGN PATENT DOCUMENTS

| | | | |
|---|---|---|---|
| 0267082 | 5/1988 | European Pat. Off. | 437/99 |
| 0115557 | 9/1981 | Japan | 437/99 |

*Primary Examiner*—Charles L. Bowers, Jr.
*Assistant Examiner*—Lynne A. Gurley
*Attorney, Agent, or Firm*—Theodore E. Galanthay; Lisa K. Jorgenson

[57] ABSTRACT

The present application provides a CMOS device and process in which the source/drain regions are polysilicon, and are dielectrically isolated from the well regions. This structure can be obtained, for example, by depositing the first layer of polysilicon under very high temperature conditions (essentially the same as those normally used for epitaxial deposition), so that the first polysilicon layer is formed epitaxially (as monocrystalline silicon) over exposed regions, and as polycrystalline material over oxide. An oxide is grown on the surface of the deposited layer, and a second polysilicon layer is then deposited, under normal conditions, to form the gate layer. After the second polysilicon layer has been patterned, source/drain implants are then made into the first (intrinsic) polysilicon layer to form source/drain implants. Thus, the first polysilicon layer will contain both N+ and P+ regions, and if desired, may also include intrinsic regions.

32 Claims, 2 Drawing Sheets

METHOD OF MAKING A FET WITH DIELECTRICALLY ISOLATED SOURCES AND DRAINS

BACKGROUND AND SUMMARY OF THE INVENTION

The present inventions relate to integrated circuit devices and processes, and particularly to CMOS devices and processes which are highly resistant to latchup.

Background: Latchup

Latchup is one of the basic problems of CMOS technology. Consider the sequence of a PMOS source region, the surrounding N-well region, a p-well region (or p-type epitaxial layer), and an NMOS source region. This sequence of regions will inevitably occur in normal bulk CMOS designs, and it defines a thyristor. This thyristor is referred to as "parasitic," since it is not created intentionally. A thyristor is a bipolar device which has an extremely low on-resistance. Once the thyristor turns on (or "fires"), it will remain on for as long as it can draw its minimum holding current. This behavior is extremely undesirable in integrated circuits, since when such a parasitic thyristor fires it may destroy the integrated circuit (by drawing excessive current), or may rapidly discharge a portable system's battery, or may simply cause the chip to remain in a "stuck" condition, and hence become unusable, until the power supply is disconnected.

Any thyristor can be regarded as a merger of a PNP transistor with an NPN transistor, and this model is frequently a convenient way to analyze the properties of the parasitic thyristor. The gain of the parasitic thyristor is equal to the product of the gains of the bipolar transistors, so degrading the gain of either parasitic bipolar helps to degrade the parasitic thyristor. (Although the thyristor reaches low impedance once triggered, it is still useful to analyze the small-signal "gain" of the thyristor in considering triggering: lower gain will mean that a larger input energy is required to trigger the thyristor. Since voltage transients are always present, it is desirable to provide some margin of immunity against triggering by transients.) There are several ways to approach the device-level properties of the thyristor: either the holding current can be increased, or the firing voltage can be increased, or the gain of one or both of the parasitic bipolar transistors can be degraded, or low-resistance shunting elements can be added to bypass one or both of the parasitic bipolar transistors (so that the current driven by one transistor does not all appear as base current on the other).

Background: Punchthrough

Another of the basic problems in normal CMOS (or almost any other field-effect transistor formed in bulk material) is punchthrough: when the depletion regions around the source/drain boundaries spread sufficiently to touch, then current can bypass the channel region, i.e. the source and drain are essentially shorted together.

Innovative CMOS Device and Process

The present application provides a CMOS device and process in which the source/drain regions are polysilicon, and are dielectrically isolated from the well regions. This structure can be obtained, for example, by depositing the first layer of polysilicon under very high temperature conditions (essentially the same as those normally used for epitaxial deposition), so that the first polysilicon layer is formed epitaxially (as monocrystalline silicon) over exposed regions, and as polycrystalline material over oxide. An oxide is grown on the surface of the deposited layer, and a second polysilicon layer is then deposited, under normal conditions, to form the gate layer. After the second polysilicon layer has been patterned, source/drain implants are then made into the first (intrinsic) polysilicon layer to form source/drain implants. Thus, the first polysilicon layer will contain both N+ and P+ regions, and if desired, may also include intrinsic regions. The intrinsic regions permit high-resistivity resistors to be built in the first polysilicon layer at no extra processing cost (assuming that N+ and P+ masks are used for separate NMOS and PMOS source/drain patterning, as is now usual.)

Thus, in this structure, there is no possibility whatsoever of junction spiking. Moreover, the possibility of latch-up is greatly reduced, since the source/drain regions form a junction to the well only in locations which are immediately adjacent to the channel. Optionally, the source/drain implantation can be done as a two-step process, using sidewall dielectrics for self-aligned masking of the N+ implant, just as is conventionally done to form LDD regions.

Depending on where the junction boundaries are located, the use of polysilicon source/drain regions according to the present invention may not absolutely remove the parasitic thyristor, but it does permit the junction locations to be carefully controlled. Using control of this positioning, the basewidth of both of the two parasitic bipolars can be made huge, so that the gain of each of the parasitic bipolars is extremely low. This basewidth can be adjusted so that the parasitic thyristor will not fire under any normal conditions (except under applied voltages which would cause immediate breakdown of other parts of the integrated circuit anyway).

As usual, VT implants are used to adjust the threshold voltages of the NMOS and PMOS devices. Thus, in this device architecture, the electrical function of the well regions becomes minor. (Their primary purpose is to provide seed material for the epitaxial growth of the channel region.) The sole electrical function of the well regions is to provide back biasing for the transistors.

Because the depth and doping of the wells is electrically much less important than in a conventional CMOS process, these parameters can be optimized for other components in a mixed process. For example, in a bipolar/CMOS/DMOS or a BiCMOS process, well depth and doping can be chosen with complete freedom to optimize the gain and breakdown characteristics of the bipolar devices. An important advantage of this device structure is that it affords a highly planar structure, since the poly2 gate stripe is nested in between the elevated source/drain regions in the first polysilicon layer.

Note that the chance of punch-through is also reduced, since the source/drain junctions do not extend downwardly into the well (if at all) as deeply as the prior art junctions do.

Thus features and advantages of various embodiments of the disclosed inventions include:

1. This structure reduces the capacitance between the body and both the source and the drain.
2. The spacings between the diffused source/drain regions can be reduced, since these diffused regions are in polysilicon, and can be laterally separated by etching.
3. Contact spiking through source/drain regions is no longer a concern, since all source/drain regions now have a layer of dielectric beneath them.
4. Susceptibility to latch-up is reduced, since there is less (if any) of the source/drain diffusions in contact with the body regions.
5. Susceptibility to hot carrier effects becomes less of a problem, since the drain region near the gate is polysilicon. Electrons have a lower velocity in polysilicon, which makes it more difficult for them to tunnel into the gate dielectric.

6. The process steps used to provide the structures can be included in a more complex process sequence such as BiCMOS technology.
7. The basic structure can be used in a variety of technologies, including NMOS, PMOS, CMOS, DMOS, or JFET.

Note that the edge of the oxide which defines the active region is not self-aligned to the gate in the second polysilicon layer. This introduces an additional design parameter. For instance, by making the second polysilicon gate wider than the oxide opening which defines the width of the crystalline silicon region, a degree of underlap is achieved which may cause a region of more lightly doped silicon, having a doping determined by lateral diffusion which becomes lighter going from the drain to the channel, and thus automatically provides a lightly doped drain profile to reduce hot carrier effects. Manipulation of this kind can be used in combination with the conventional side-wall-oxide-defined LDD regions, or even with a conventional double-diffused graded drain (formed by differential diffusion of phosphorous plus arsenic). Unlike the conventional LDD and graded drain techniques, this new technique permits ASYMMETRY in the transistor, in that the source and drain regions do not have to have exactly the same profile. Thus the potential contour of the drain boundary can be optimized without adding series resistance on the source side.

The thickness of the oxide which is used to determine the size of the monocrystalline silicon region is not critical. Thus, again, the thickness of this oxide can be determined by other considerations. For example, in smart power processes, the oxide layer can be used for the gate oxide of VDMOS or LDMOS high voltage and/or high-current transistors.

In one class of embodiments, this device structure can be used for just one of the device types in a CMOS integrated circuit. For example, by making the PMOS devices, but not the NMOS devices, in the poly1/epi layer, the NMOS and PMOS devices can actually be overlapped with each other. (The removal of the PMOS devices from the substrate is enough to inhibit latchup.) Thus, this provides significant advantages in density.

Further advantages in density are provided by the improved tolerance to contact misalignment. In conventional structures, a misaligned contact to the active area may chew through the corner of the field oxide to expose the channel stop diffusion (and thus potentially cause a short circuit). Similarly, a misaligned contact to polysilicon over active may make contact to the source/drain region. Normally design rules are selected to make these mishaps adequately unlikely, but the present invention permits these design rules to be relaxed (and hence improves density and/or yield).

In the presently preferred embodiment, the oxide which is used to define apertures where crystalline material will be grown is not itself field oxide, but is used in combination with a LOCOS field oxide which covers the margins of the P-well and N-well regions. Alternatively, various other techniques for field isolation can be used, or it may even be possible to eliminate the field oxide (IF the combination of on-chip voltages, dielectric thickness under the polysilicon lines, and substrate doping under the polysilicon lines combine, according to well-known formulas, so that the parasitic transistors do not turn on).

In a further class of embodiments, the same process flow can be used to provide a self-aligned channel stop implant. To implement this, a channel stop implant is performed (with an energy which is selected to reach through the oxide thickness), after the gate structure in poly-2 is in place. (Depending on the desired lateral spacing of the channel stop diffusions, this implant can be performed with or without sidewall spacers on the gate.) This provides an important further step toward a process with no thick field-oxide at all. Such a process provides important advantages of reduced topography, reduced diffusion length of buried layers, and reduced process complexity.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1:
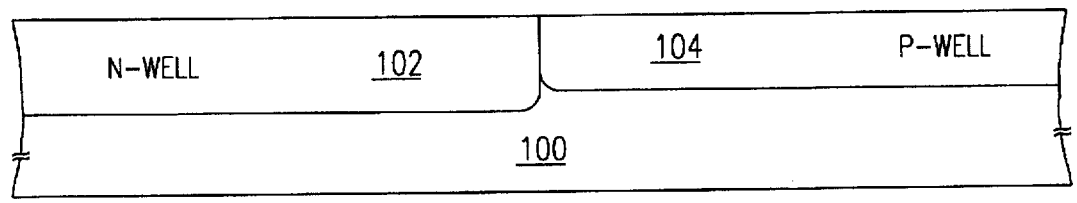
FIGS. 1–8 show sequential steps in fabrication of an integrated circuit device using the methods of the present invention.

The numerous innovative teachings of the present application will be described with particular reference to the presently preferred embodiment (by way of example, and not of limitation), in which:

FIG. 1 schematically shows a sample CMOS device structure after an N-well 102 and a P-well 104 have been fabricated in a monocrystalline substrate 100.

Figure 2:
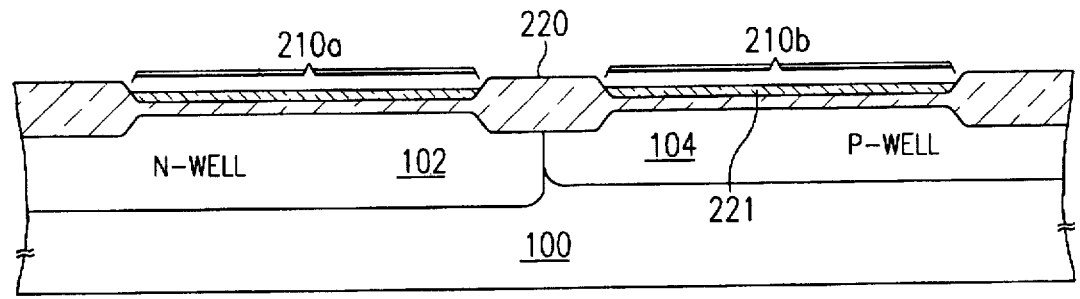

FIG. 2 schematically shows the structure of FIG. 1, after a LOCOS field oxide 220 (patterned using an oxide/nitride active stack 221) has been grown to define active areas 210A and 210B (for PMOS and NMOS devices respectively).

Figure 3:
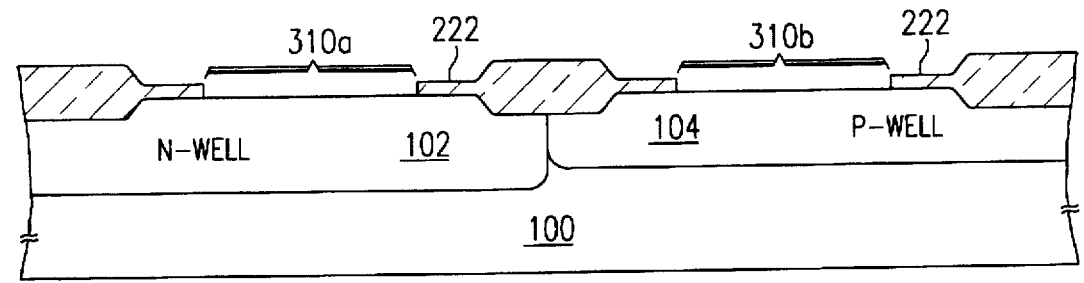

FIG. 3 schematically shows the structure of FIG. 2, after a thin oxide 222 has been grown over the active areas 210, and has been patterned to expose channel areas 310A and 310B within the active areas 210A and 210B. (This is a nonstandard step, and the importance of these channel areas will become apparent in FIG. 4.)

Figure 4:
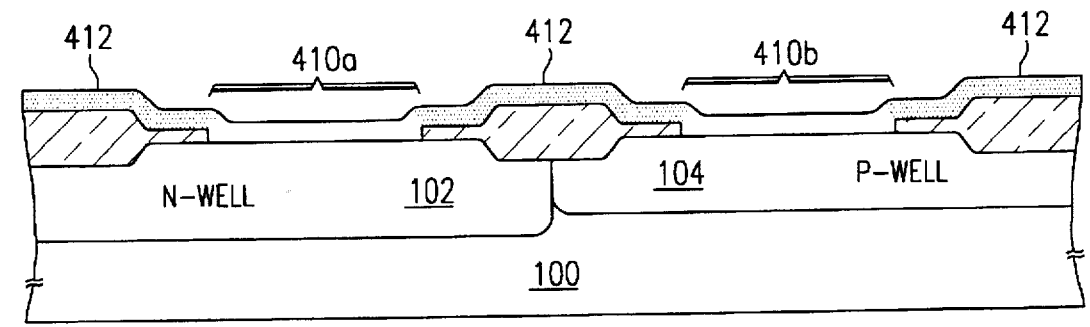

FIG. 4 schematically shows the structure of FIG. 3, after intrinsic silicon is deposited (e.g. at 900° C., to a thickness of 1000 Å). (Alternatively, the thickness of this layer can be in the range of 400–4000Å, and the deposition temperature can be in the range of 800°–1000° C.). (This step is of course preceded by a cleaning step.) This step will epitaxially deposit a thin layer 410A or 410B of monocrystalline silicon over the channel region 310A or 310B respectively, and will deposit polycrystalline silicon 412 ("poly1") everywhere else.

Figure 5:
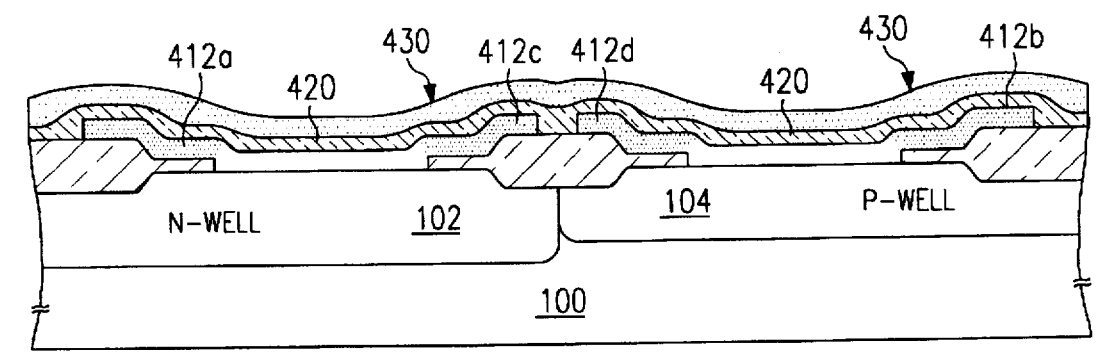

FIG. 5 schematically shows the structure of FIG. 4, after a thin gate oxide 420 has been grown conventionally and a second polysilicon layer 430 has been conventionally deposited. The gate oxide 420 may be grown to e.g. 100 Å over the monocrystalline channel regions 410, and will typically be slightly thicker and rougher over the polycrystalline portion 412. A second polysilicon layer 430 ("poly2") is then deposited, e.g. to 3500 Å thick.

Figure 6:
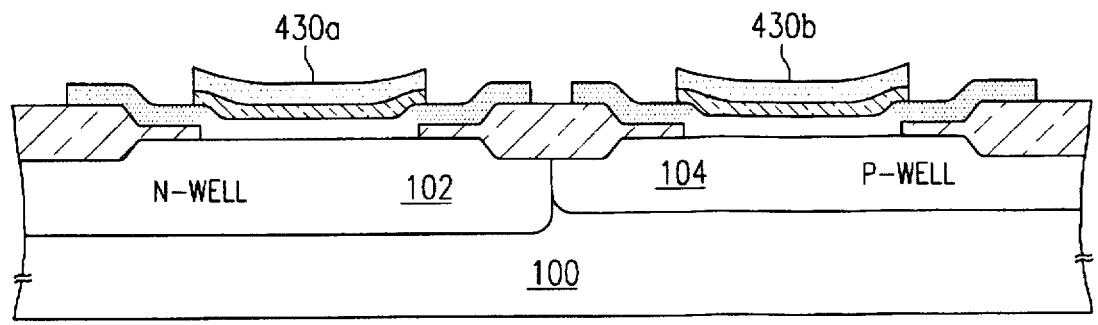

FIG. 6 schematically shows the structure of FIG. 5, after the poly2 layer has been patterned to produce a structure which includes, inter alia, PMOS gate portions 430A and NMOS gate portions 430B.

A salicide step can optionally be performed at this point (or optionally after source/drain implantation), to reduce the sheet resistance of poly1 regions 412 (by cladding them with silicide).

Figure 7:
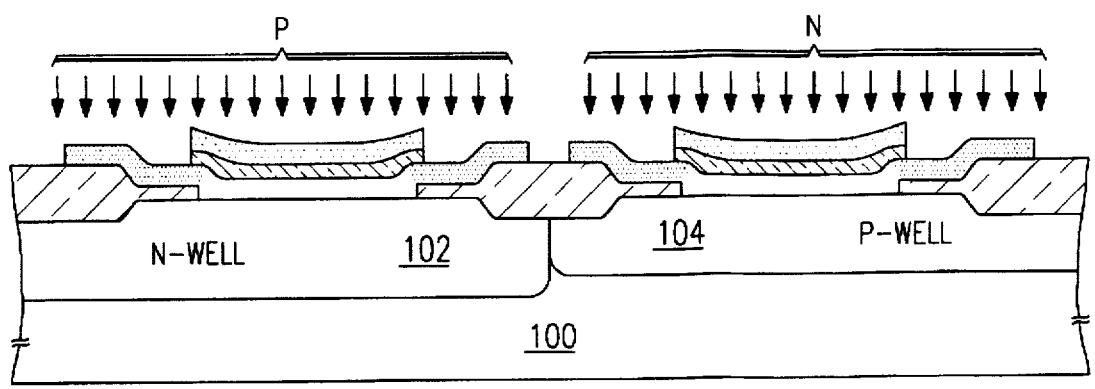

FIG. 7 schematically shows the structure of FIG. 6, during two further process steps: P-type dopants are applied in a shallow heavy implant (e.g. $10^{16} \text{cm}^{-2}$ of $BF_2^-$ at 30 keV) to the area over the N-wells 102, and N-type dopants are applied in a shallow heavy implant (e.g. $5 \times 10^{15} \text{cm}^{-2}$ of $As^+$ at 20 keV) to the area over the P-wells 104. Note that these implants dope some portions of the poly1 regions 412 N+, and other regions P+. The poly2 layer can be used to provide a short connection from N+ poly1 to P+ poly (particularly if a saliciding step has been performed as discussed above).

The poly2 layer will also be doped by this implant. By selecting the dose appropriately the second poly layer can be doped N+ over NMOS channel regions 410B, and P+ over PMOS channel regions 410A. This eliminates the work function difference which primarily causes VLSI PMOS devices to have buried channels.

Optionally sidewall spacers can be conventionally formed on the poly2 layer, to adjust the source/drain underlap.

Figure 8:
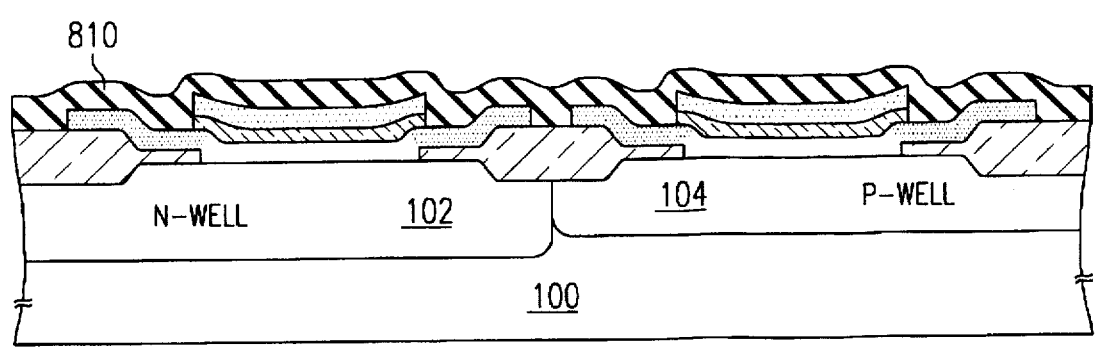

FIG. 8 schematically shows the structure of FIG. 7 after a final step of brief oxidation (to seal the poly1 and poly2 layers) and deposition of an interlevel dielectric 810 (e.g. BPSG over TEOS-deposited oxide).

Processing then continues conventionally, with formation of contact holes, formation of a patterned metal layer, formation of protective overcoat, and patterning to expose bond pad locations. Optionally, a third layer of polysilicon can be added to the process. Optionally, two or more layers of metallization can be used, using techniques well known to those of ordinary skill in the art.

Figure 9:
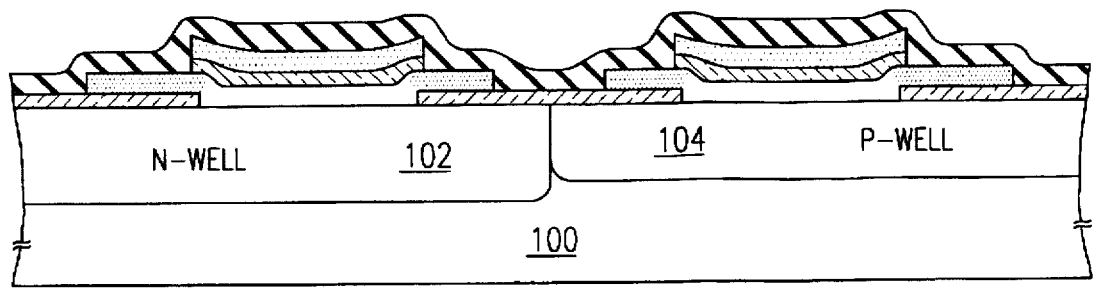
FIG. 9 shows an alternative embodiment in which no thick field oxide is used.

FIG. 9 shows an alternative embodiment in which no thick field oxide is used. As discussed above, a self-aligned channel-stop implant can be used to avoid the need for growth of a thick field oxide.

According to a disclosed class of innovative embodiments, there is provided: A method for fabricating integrated circuit devices, comprising the steps of: providing a substrate which includes at least one substantially monolithic body of semiconductor material; covering part of the surface of the monolithic body with a patterned dielectric layer, the patterned dielectric layer leaving the monolithic body exposed in transistor channel locations; forming additional semiconductor material, as monocrystalline semiconductor material on the monolithic body in the transistor channel locations, and as polycrystalline semiconductor material elsewhere; the semiconductor material being formed to a thickness which is greater than the thickness of the patterned dielectric layer; patterning the additional material to form a patterned thin film layer, and forming a gate dielectric on the additional material; forming an additional patterned conductive thin film layer on the gate dielectric; implanting dopants of a desired conductivity type into the additional material where exposed by the additional patterned conductive thin film layer; whereby monocrystalline portions of the additional material beneath the additional patterned conductive thin film layer form transistor channel regions, and polycrystalline portions of the additional material provide source and drain regions adjacent thereto.

According to another disclosed class of innovative embodiments, there is provided: A method for fabricating integrated circuit devices, comprising the steps of: providing a substrate which includes at least one substantially monolithic body of semiconductor material; covering part of the surface of the monolithic body with a patterned dielectric layer, the patterned dielectric layer leaving the monolithic body exposed in transistor channel locations; depositing additional semiconductor material overall, as epitaxially matched monocrystalline semiconductor material on the monolithic body in the transistor channel locations, and as polycrystalline semiconductor material elsewhere; the semiconductor material being formed to a thickness which is greater than the thickness of the patterned dielectric layer; patterning the additional material to form a patterned thin film layer, and forming a gate dielectric on the additional material; forming an additional patterned conductive thin film layer, comprising polycrystalline semiconductor material, on the gate dielectric; and implanting dopants of a desired conductivity type into the additional material where exposed by the additional patterned conductive thin film layer; whereby monocrystalline portions of the additional material beneath the additional patterned conductive thin film layer form transistor channel regions, and polycrystalline portions of the additional material provide source and drain regions adjacent thereto.

According to another disclosed class of innovative embodiments, there is provided: A method for fabricating CMOS integrated circuit devices, comprising the steps of: providing a substrate which includes at least one substantially monolithic body of semiconductor material, having at least one first-conductivity-type surface region and at least one second-conductivity-type surface region; covering part of the surface of the monolithic body with a patterned dielectric layer, the patterned dielectric layer leaving the monolithic body exposed in transistor channel locations; forming additional semiconductor material, as monocrystalline semiconductor material on the monolithic body in the transistor channel locations, and as polycrystalline semiconductor material elsewhere; the semiconductor material being formed to a thickness which is greater than the thickness of the patterned dielectric layer; patterning the additional material to form a patterned thin film layer, and forming a gate dielectric on the additional material; forming an additional patterned conductive thin film layer on the gate dielectric; implanting dopants of the first conductivity type over locations of the second-conductivity-type regions of the body, and implanting dopants of the second conductivity type over locations of the first-conductivity-type regions of the body, to dope the additional material where exposed by the additional patterned conductive thin film layer; whereby monocrystalline portions of the additional material beneath the additional patterned conductive thin film layer form transistor channel regions, and polycrystalline portions of the additional material provide source and drain regions adjacent thereto.

According to another disclosed class of innovative embodiments, there is provided: an integrated circuit field-effect transistor structure, comprising: a monocrystalline semiconductor channel region; a conductive gate capacitively coupled to the channel region; a monocrystalline semiconductor body region which underlies and is epitaxially continuous with the channel region; first and second polycrystalline semiconductor source/drain regions which laterally adjoin opposing sides of the channel region, and each extend continuously therefrom; and a patterned dielectric layer, which underlies the source/drain regions but not the channel region; the patterned dielectric layer being thinner than the semiconductor source/drain regions.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. Many (but not all) of these alternative classes of embodiments are listed above.

For example, the illustrated sample embodiment is a twin-tub structure, but of course this does not by any means limit the invention.

For example, it may also be possible, alternatively and less preferably, to obtain the disclosed structure by laser or e-beam annealing recrystallization methods.

For another example, it should be noted that it is not necessary to use the disclosed epitaxial portions only for transistors. Since the gate oxide overlies the epitaxial portions, these portions would be used also for MOS capacitors.

It is also possible to use counterdoping or other mask-saving tricks adapted from conventional CMOS processes.

When the P+ and N+ implants which dope poly1 are performed, the masking can optionally be adjusted to leave part of poly1 undoped. Such intrinsic material has a very high sheet resistance, and can be used for a variety of purposes (even in a CMOS structure), e.g. defining power-on states, providing low-power voltage divider chains, power-supply-dropping in very-low-power circuits, and rad-hard gates (using a resistor interposed between the two nodes of a CMOS latch).

What is claimed is:

1. A method for fabricating integrated circuit devices, comprising the steps of:
   (a.) providing a substrate which includes at least one monolithic body of semiconductor material;
   (b.) covering part of the surface of said monolithic body with a patterned dielectric layer, said patterned dielectric layer leaving said monolithic body exposed in transistor channel locations;
   (c.) forming additional semiconductor material, as monocrystalline semiconductor material on said monolithic body in said transistor channel locations, and as polycrystalline semiconductor material elsewhere; said additional semiconductor material being formed to a thickness which is greater than the thickness of said patterned dielectric layer;
   (d.) patterning said additional semiconductor material to form a patterned thin film layer, and forming a gate dielectric on said additional semiconductor material;
   (e.) forming an additional patterned conductive thin film layer on said gate dielectric; and
   (f.) implanting dopants of a desired conductivity type into said additional semiconductor material where exposed by said additional patterned conductive thin film layer;
   said steps (e.) and (f.) forming a completed transistor wherein
      a monocrystalline portion of said additional semiconductor material beneath said additional patterned conductive thin film layer forms a transistor channel region,
      said additional patterned conductive thin film layer provides an insulated gate which is coupled to said transistor channel region,
      and said implanting step (f.) forms source and drain regions which lie entirely within polycrystalline portions of said additional semiconductor material.

2. The method of claim 1, wherein said semiconductor material is silicon.

3. The method of claim 1, wherein said patterned dielectric layer and said gate dielectric both consist of silicon dioxide.

4. The method of claim 1, further comprising the additional step of forming a sidewall spacer on said additional patterned conductive thin film layer prior to said implanting step (f.).

5. The method of claim 1, further comprising the additional step of doping said additional semiconductor material prior to said forming step (e.).

6. The method of claim 1, further comprising the additional step of forming at least one first-conductivity-type surface region and at least one second-conductivity-type surface region prior to said covering step (b.).

7. The method of claim 1, further comprising the additional step of forming a patterned thick field dielectric region, which is more than twice as thick as said patterned dielectric layer, prior to said covering step (b.).

8. The method of claim 1, wherein said additional patterned conductive thin film layer comprises polycrystalline semiconductor material.

9. The method of claim 1, wherein said completed transistor is asymmetrical, and wherein said source and drain regions have different diffusion profiles.

10. The method of claim 1, wherein said patterned dielectric layer is not self-aligned to said gate.

11. The method of claim 1, wherein part of said polycrystalline semiconductor material is left undoped to provide intrinsic material having a high sheet resistance.

12. A method for fabricating integrated circuit devices, comprising the steps of:
   (a.) providing a substrate which includes at least one monolithic body of semiconductor material;
   (b.) covering part of the surface of said monolithic body with a patterned dielectric layer, said patterned dielectric layer leaving said monolithic body exposed in transistor channel locations;
   (c.) depositing additional semiconductor material overall, as epitaxially matched monocrystalline semiconductor material on said monolithic body in said transistor channel locations, and as polycrystalline semiconductor material elsewhere; said additional semiconductor material being formed to a thickness which is greater than the thickness of said patterned dielectric layer;
   (d.) patterning said additional semiconductor material to form a patterned thin film layer, and forming a gate dielectric on said additional semiconductor material;
   (e.) forming an additional patterned conductive thin film layer, comprising polycrystalline semiconductor material, on said gate dielectric; and
   (f.) implanting dopants of a desired conductivity type into said additional semiconductor material where exposed by said additional patterned conductive thin film layer;
   said steps (e.) and (f.) forming a complete transistor wherein
      a monocrystalline portion of said additional semiconductor material beneath said additional patterned conductive thin film layer forms a transistor channel region,
      and said implanting step (f.) forms source and drain regions which lie entirely within polycrystalline portions of said additional semiconductor material and which lie entirely over said patterned dielectric layer.

13. The method of claim 12, wherein said semiconductor material is silicon.

14. The method of claim 12, wherein said patterned dielectric layer and said gate dielectric both consist of silicon dioxide.

15. The method of claim 12, further comprising the additional step of forming a sidewall spacer on said additional patterned conductive thin film layer prior to said implanting step (f.).

16. The method of claim 12, further comprising the additional step of doping said additional semiconductor material prior to said forming step (e.).

17. The method of claim 12, further comprising the additional step of forming at least one first-conductivity-type surface region and at least one second-conductivity-type surface region prior to said covering step (b.).

18. The method of claim 12, further comprising the additional step of forming a patterned thick field dielectric region, which is more than twice as thick as said patterned dielectric layer, prior to said covering step (b.).

19. The method of claim 12, wherein said additional patterned conductive thin film layer comprises polycrystalline semiconductor material.

20. The method of claim 12, wherein said completed transistor is asymmetrical, and wherein said source and drain regions have different diffusion profiles.

21. The method of claim 12, wherein said patterned dielectric layer is not self-aligned to said gate.

22. The method of claim 12, wherein part of said polycrystalline semiconductor material is left undoped to provide intrinsic material having a high sheet resistance.

23. A method for fabricating CMOS integrated circuit devices, comprising the steps of:

(a.) providing a substrate which includes at least one monolithic body of semiconductor material, having at least one first-conductivity-type surface region and at least one second-conductivity-type surface region;

(b.) covering part of the surface of said monolithic body with a patterned dielectric layer, said patterned dielectric layer leaving said monolithic body exposed in transistor channel locations;

(c.) forming additional semiconductor material, as monocrystalline semiconductor material on said monolithic body in said transistor channel locations, and as polycrystalline semiconductor material elsewhere; said additional semiconductor material being formed to a thickness which is greater than the thickness of said patterned dielectric layer;

(d.) patterning said additional semiconductor material to form a patterned thin film layer, and forming a gate dielectric on said additional semiconductor material;

(e.) forming an additional patterned conductive thin film layer on said gate dielectric; and (f.) implanting dopants of said first conductivity type over locations of said second-conductivity-type regions of said monolithic body, and implanting dopants of said second conductivity type over locations of said first-conductivity-type regions of said monolithic body, to dope said additional semiconductor material where exposed by said additional patterned conductive thin film layer;

said steps (e.) and (f.) forming a completed transistor wherein a monocrystalline portion of said additional semiconductor material beneath said additional patterned conductive thin film layer forms a transistor channel region, said additional patterned conductive thin film layer provides an insulated gate which is coupled to said transistor channel region, and said implanting step (f.) forms source and drain regions which lie entirely within polycrystalline portions of said additional semiconductor material over said patterned dielectric layer.

24. The method of claim 23, wherein said semiconductor material is silicon.

25. The method of claim 23, wherein said patterned dielectric layer and said gate dielectric both consist of silicon dioxide.

26. The method of claim 23, further comprising the additional step of forming a sidewall spacer on said additional patterned conductive thin film layer prior to said implanting step (f.).

27. The method of claim 23, further comprising the additional step of doping said additional semiconductor material prior to said forming step (e.).

28. The method of claim 23, further comprising the additional step of forming at least one first-conductivity-type surface region and at least one second-conductivity-type surface region prior to said covering step (b.).

29. The method of claim 23, further comprising the additional step of forming a patterned thick field dielectric region, which is more than twice as thick as said patterned dielectric layer, prior to said covering step (b.).

30. The method of claim 23, wherein said completed transistor is asymmetrical, and wherein said source and drain regions have different diffusion profiles.

31. The method of claim 23, wherein said patterned dielectric layer is not self-aligned to said gate.

32. The method of claim 23, wherein part of said polycrystalline semiconductor material is left undoped to provide intrinsic material having a high sheet resistance.

* * * * *